United States Patent
Guo et al.

(10) Patent No.: US 12,247,282 B2
(45) Date of Patent: Mar. 11, 2025

(54) EVAPORATOR BOATS FOR METALLIZATION INSTALLATIONS

(71) Applicant: Kennametal Inc., Latrobe, PA (US)

(72) Inventors: Zhiquan Guo, Shanghai (CN); Mark Han, Shanghai (CN); Chandler Du, Shanghai (CN); Jason Goldsmith, Greensburg, PA (US); Rob Lattimer, Wilton, CT (US)

(73) Assignee: KENNAMETAL INC., Latrobe, PA (US)

( * ) Notice: Subject to any disclaimer, the term of this patent is extended or adjusted under 35 U.S.C. 154(b) by 549 days.

(21) Appl. No.: 15/469,192

(22) Filed: Mar. 24, 2017

(65) Prior Publication Data

US 2019/0203344 A1    Jul. 4, 2019

(51) Int. Cl.
*C23C 14/24* (2006.01)
*B23B 3/02* (2006.01)
*B28B 3/02* (2006.01)
*C23C 14/14* (2006.01)
*C23C 14/26* (2006.01)

(52) U.S. Cl.
CPC ............ *C23C 14/243* (2013.01); *B28B 3/025* (2013.01); *C23C 14/14* (2013.01); *C23C 14/26* (2013.01)

(58) Field of Classification Search
CPC ....... C23C 14/243; C23C 14/14; C23C 14/26; B28B 3/025; C04B 35/5611; C04B 35/5622; C04B 35/58071; C04B 35/645; C09K 3/1418; C22C 29/02

USPC ....... 329/389, 386, 388, 390–392, 394, 398; 118/726, 727; 264/204; 51/307, 87, 298, 51/308, 309

See application file for complete search history.

(56) References Cited

U.S. PATENT DOCUMENTS 2,862,828 A * 12/1958 Glaser ............... C04B 35/58064
501/96.3
3,724,996 A *  4/1973 Montgomery ........ C04B 35/583
432/264
4,076,506 A *  2/1978 Valdsaar ............. C04B 35/5611
501/87

(Continued)

FOREIGN PATENT DOCUMENTS

CN        1114103 A       12/1995
CN        1782110 A        6/2006

(Continued)

OTHER PUBLICATIONS

3M Evaporation Boats.

(Continued)

*Primary Examiner* — Sang Y Paik
(74) *Attorney, Agent, or Firm* — Christopher J. Owens

(57) ABSTRACT

In one aspect, evaporator boats are provided which, in some embodiments, exhibit resistance to corrosion and associated performance degradation imparted by exposure to molten metals, including aluminum. An evaporator boat described herein comprises a body and an evaporator surface, the body comprising a boron nitride (BN) component and a $TiB_2$ component including a solid solution of $TiB_2$ and one or more elements selected from the group consisting of silicon and metallic elements of Groups IVB-VIIIB of the Periodic Table.

13 Claims, 10 Drawing Sheets

(56) References Cited

U.S. PATENT DOCUMENTS

| | | | | |
|---|---|---|---|---|
| 4,334,928 | A | * | 6/1982 | Hara .................. B23B 27/148 |
| | | | | 75/238 |
| 4,630,665 | A | * | 12/1986 | Novak, Jr. ............ B22D 19/14 |
| | | | | 164/110 |
| 6,277,774 | B1 | * | 8/2001 | Xiao .................... B22F 1/0018 |
| | | | | 501/12 |
| 7,494,616 | B2 | * | 2/2009 | Rusinko, Jr. ......... C23C 14/243 |
| | | | | 266/275 |
| 10,513,771 | B2 | | 12/2019 | Nurnberger et al. |
| 10,689,750 | B2 | | 6/2020 | Grau et al. |
| 2007/0110412 | A1 | | 5/2007 | Rusinko |
| 2008/0020920 | A1 | * | 1/2008 | Yokota ................. C04B 35/645 |
| | | | | 501/135 |
| 2009/0129762 | A1 | | 5/2009 | Goetz et al. |
| 2009/0217876 | A1 | | 9/2009 | Epstein |
| 2010/0114479 | A1 | | 5/2010 | Hashimoto |
| 2010/0122903 | A1 | * | 5/2010 | Landwehr ............. C01B 35/04 |
| | | | | 264/618 |
| 2011/0013891 | A1 | * | 1/2011 | Nurnberger ........... C23C 14/243 |
| | | | | 392/388 |
| 2011/0052931 | A1 | * | 3/2011 | Morton ................. B32B 15/043 |
| | | | | 428/552 |
| 2014/0202597 | A1 | * | 7/2014 | Waniuk .................. C04B 35/01 |
| | | | | 266/287 |

FOREIGN PATENT DOCUMENTS

| | | |
|---|---|---|
| CN | 1894171 A | 1/2007 |
| CN | 101033134 A | 9/2007 |
| CN | 101978092 A | 2/2011 |
| DE | 1907099 U | 12/1964 |
| DE | 1907099 A1 | 3/1970 |
| DE | 3935163 C1 | 10/1990 |
| DE | 102004009335 A1 | 9/2005 |
| DE | 102005020945 A1 | 11/2006 |
| DE | 102005057220 | 6/2007 |
| DE | 102015211746 A1 | 12/2016 |
| EP | 0337391 A3 | 2/1990 |
| EP | 0337391 B1 | 7/1992 |
| JP | S56156761 A | 12/1981 |

OTHER PUBLICATIONS

Oct. 25, 2018 Office Action (non-US).
May 27, 2021 Office Action (non-US) CN App. No. 108728797A.
Dec. 30, 2021 Office Action (non-US) CN App. No. 108728797A.
Jun. 2, 2022 Office Action (non-US) CN App. No. 108728797A.
Feb. 10, 2020 Examination notification CN No. 108728797A.
Nov. 2, 2022 Foreign Office Action German Application No. 201810106510.8, 10 pages.

* cited by examiner

EVAPORATOR BOATS FOR METALLIZATION INSTALLATIONS

FIELD

The present invention relates to evaporator boats for metallization installations and, in particular, to evaporator boats employing one or more metal additives or metal containing additives.

BACKGROUND

A common method for coating flexible substrates with metals, such as aluminum, is vacuum band metallization according to PVD (physical vapor deposition) technology. Suitable flexible substrates include paper, plastic foils and textiles, and aluminum is mostly used as the metal. Such coated substrates are widely used for wrapping and decoration purposes, for the production of capacitors and in environmental technology (insulation). Coating of the flexible substrates takes place in metallization installations. In a metallization installation, the substrate to be coated is directed over a cooled roll while exposed to a metal vapor which condenses on the surface of the substrate as a thin metal layer. For generating the required constant vapor flow, electrically heatable evaporation boats are employed. Evaporation boats are generally heated to temperatures of 1450-1600° C. depending on metal. Metal wire is continuously supplied, liquefied on the surface of the vaporizer boat and vaporized under vacuum at approximately $10^{-4}$ mbar. Non-flexible substrates according to PVD-technology are coated batchwise in a discontinuous process, preferably by means of flash vaporization. Non-flexible substrates include television screens and plastic parts.

Evaporator boats used in continuous and the discontinuous methods generally consist of a hot-pressed ceramic material, the main components of which are titanium diboride and boron nitride. Titanium diboride is the electrically conductive component and boron nitride is the electrically insulating component, which, when mixed together, result in certain specific resistances. Over time, molten metal can attack and corrode the evaporator boat. Molten aluminum, for example, can dissolve $TiB_2$, wherein the dissolved $TiB_2$ precipitates at cold ends of the boat. BN can also react with molten aluminum forming aluminum nitride (AlN). In many cases, a porous AlN layer is formed on the evaporator body. FIG. 1 is a cross-sectional scanning electron microscopy (SEM) image of an evaporator body on which a porous AlN layer has formed. As illustrated in FIG. 1, a reaction interface layer is also formed between the evaporator body and porous AlN layer. The porous AlN layer can exhibit good electrical conductivity, lowering the electrical resistivity of the evaporator body. Moreover, the reaction interface layer can deplete $TiB_2$. Lower electrical resistivity frustrates heating of the evaporator boat while $TiB_2$ depletion compromises electrical and mechanical properties of the boat. Such effects degrade boat performance and can induce premature boat replacement.

SUMMARY

In one aspect, evaporator boats are provided which, in some embodiments, exhibit resistance to corrosion and associated performance degradation imparted by exposure to molten metals, including aluminum. Briefly, an evaporator boat described herein comprises a body and an evaporator surface, the body comprising a boron nitride (BN) component and a $TiB_2$ component including a solid solution of $TiB_2$ and one or more elements selected from the group consisting of silicon and metallic elements of Groups IVB-VIIIB of the Periodic Table. In some embodiments, for example, one or more elements forming solid solution with $TiB_2$ of the evaporator body are selected from the group consisting of zirconium, hafnium, vanadium, niobium, tantalum, chromium, molybdenum, tungsten, iron, cobalt and silicon.

In another aspect, metallization installations are provided. In some embodiments, a metallization installation comprises a plurality of evaporator boats and metal sources. One or more of the evaporator boats comprises a body and an evaporator surface, the body comprising a boron nitride (BN) component and a $TiB_2$ component including a solid solution of $TiB_2$ and one or more elements selected from the group consisting of silicon and metallic elements of Groups IVB-VIIIB of the Periodic Table.

In a further aspect, methods of making evaporator boats are described herein. In some embodiments, a method of making an evaporator boat comprises providing a powder mixture including a BN component, a $TiB_2$ component and a metal component and press-heating the powder mixture to provide a boat body, wherein a solid solution of $TiB_2$ and one or more metals from the metal component is formed. Metals from the metal component can comprise silicon and/or transition metals from Groups IVB-VIIIB of the Periodic Table. In some embodiments, one or more metals forming solid solution with $TiB_2$ of the evaporator body are selected from the group consisting of zirconium, hafnium, vanadium, niobium, chromium, tantalum, molybdenum, tungsten, iron, cobalt and silicon. As described further herein, one or more metals of the metal component can be provided to the powder mixture as metal powder, metal carbide powder, metal oxide powder, metal nitride powder or metal boride powder or various combinations thereof.

These and other non-limiting embodiments are further described in the following detailed description.

DETAILED DESCRIPTION

Figure 1:
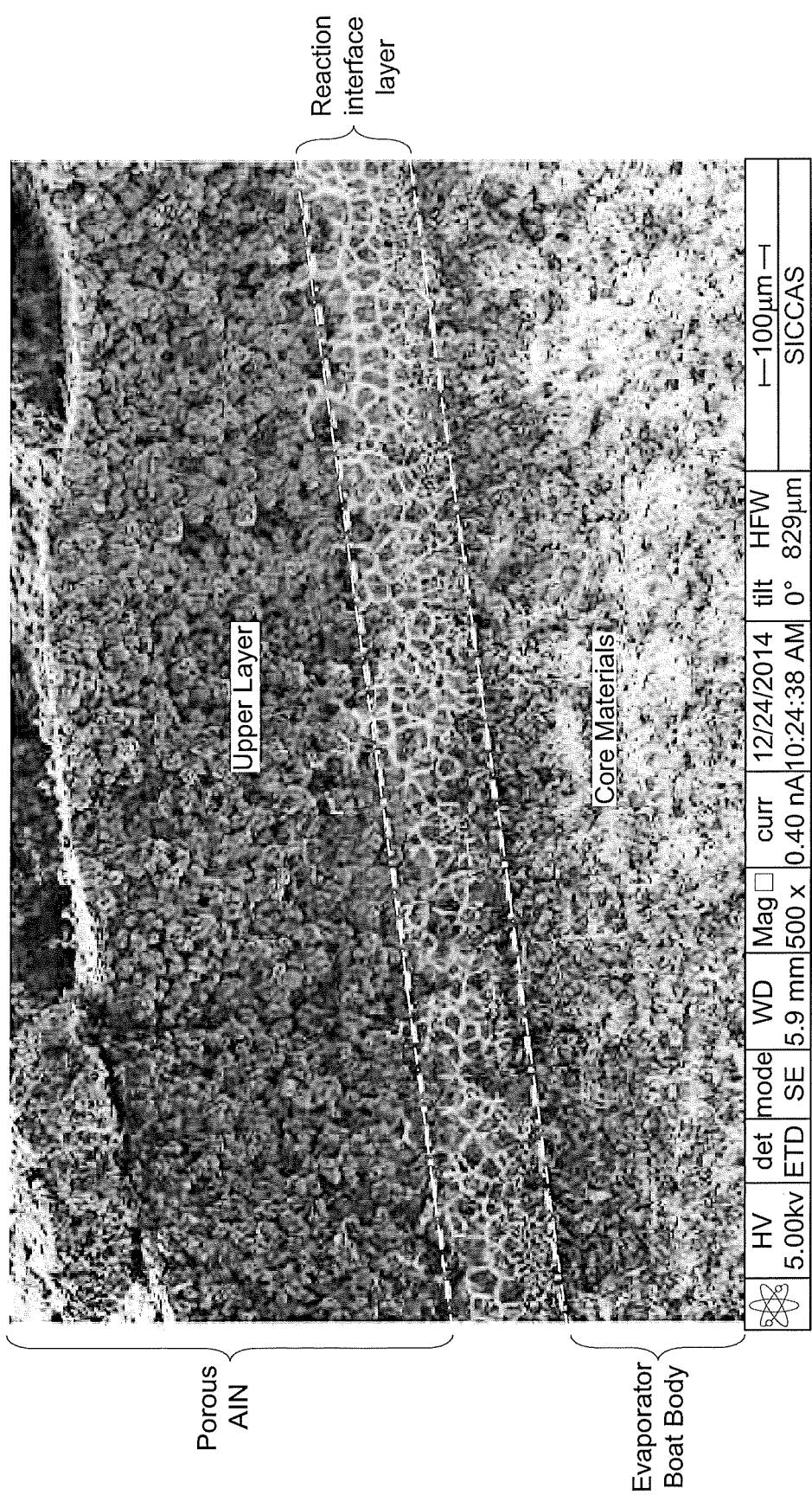
FIG. 1 is a cross-sectional SEM image of an evaporator body on which a porous MN layer has formed.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

As described herein, an evaporator boat comprises a body and an evaporator surface, the body comprising a boron nitride (BN) component and a TiB$_2$ component including a solid solution of TiB$_2$ and one or more elements selected from the group consisting of silicon and metallic elements of Groups IVB-VIIIB of the Periodic Table. Weight percent of the BN component and TiB$_2$ component can be set at any values not inconsistent with the objectives of the present invention. BN and TiB$_2$ weight percent can be selected according to several considerations including desired electrical resistivity, thermal conductivity and/or flexural strength of the evaporator boat. For example, weight percent of each of BN and TiB$_2$ can be set to provide the evaporator boat a specific electrical resistivity (1600° C.) of 600 to 6000 μΩ·cm. In some embodiments, an evaporator boat has a specific electrical resistivity selected from Table I.

TABLE I

| Evaporator Boat Electrical Resistivity 1600° C. (μΩ · cm) |
|---|
| 800-4000 |
| 2000-3500 |
| 2500-3500 |
| 2800-3400 |
| 2900-3300 |

The BN component, in some embodiments, is present in the evaporator boat in an amount of 25-75 weight percent. In other embodiments, weight percent of the BN component can be selected from Table II.

TABLE II

| BN Component (wt. %) |
|---|
| 30-70 |
| 35-65 |
| 40-60 |
| 45-55 |

Moreover, the TiB$_2$ component can be present in the evaporator body in an amount of 25-75 weight percent. In some embodiments, weight percent of the TiB$_2$ component can be selected from Table III.

TABLE III

| TiB$_2$ Component (wt. %) |
|---|
| 30-70 |
| 35-65 |
| 40-60 |
| 45-55 |

In some embodiments, the BN component and TiB$_2$ component are each present in the evaporator boat in an amount of 50 wt % (+5 wt %). Additionally, the BN component and TiB$_2$ component can each exhibit an average grain size of 1 μm to 20 μm. In some embodiments, the BN component and/or TiB$_2$ component have an average grain size of 5 μm to 20 μm or 10 μm to 20 μm. In further embodiments, the body of the evaporator boat comprises an aluminum nitride (AlN) component in addition to the BN and TiB$_2$ components. The AlN component can be present in any amount not inconsistent with the objectives of the present invention. For example, AlN can be present with BN and TiB$_2$ in an amount providing the evaporator boat a specific electrical resistivity selected from Table I.

As described herein, the TiB$_2$ component comprises a solid solution of TiB$_2$ and one or more elements selected from the group consisting of silicon and metallic elements of Groups IVB-VIIIB of the Periodic Table. For example, one or more elements forming solid solution with TiB$_2$ of the evaporator body can be selected from the group consisting of zirconium, hafnium, vanadium, niobium, tantalum, molybdenum, tungsten, iron, cobalt and silicon. In some embodiments, the solid solution of one or more metals with TiB$_2$ is present throughout the evaporator body, including the evaporator surface. Additionally, metal(s) of the solid solution may be present in the evaporator boat in an amount less than or equal to the metal's solubility limit in TiB$_2$. Alternatively, metal(s) of the solid solution may be present in the evaporator boat in an amount greater than the metal's solubility limit in TiB$_2$. In some embodiments, a transition metal forming solid solution with TiB$_2$ is present in the evaporator boat in an amount of 0.1 to 15 weight percent.

The BN component can also comprise a solid solution phase, in some embodiments. The BN component, for example, can comprise a solid solution of BN and at least one or more elements selected from the group consisting of silicon and metallic elements of Groups IVB-VIIIB of the Periodic Table. In some embodiments, the BN component comprises a solid solution of BN and one or more of titanium, zirconium, hafnium, vanadium, niobium, tantalum, chromium, molybdenum, tungsten, iron, cobalt and silicon.

Evaporator boats described herein can comprise grain boundary phases including one or more metals, metal oxides, metal borides and/or metal carbides. In some embodiments, grain boundary phases comprise one or more transition metals, transition metal oxides, metal borides, transition metal carbides, alkaline earth metals or mixtures thereof. Grain boundary phases can vary compositionally according to local chemical environment in the evaporator boat body. For example, Table IV describes grain boundary phase compositions at various locations in the evaporator body.

TABLE IV

Grain Boundary Phases

| Location | Metallic Element Composition |
|---|---|
| BN/BN grain boundaries | titanium, tungsten, iron, cobalt and/or calcium |
| $TiB_2/TiB_2$ grain boundaries | cobalt and/or calcium |
| $BN/TiB_2$ grain boundaries | titanium and one or more metals |

In some embodiments, one or more metals of a $BN/TiB_2$ grain boundary phase comprise transition metals selected from Groups IV-VIIIB of the Periodic Table. A $BN/TiB_2$ grain boundary phase, for example, can comprise tungsten and/or cobalt in addition to titanium.

The evaporator surface of the boat can have any geometry, recesses and/or other surface features not inconsistent with the objectives of the present invention. In some embodiments, the evaporator boat comprises a singular reservoir or recess extending along the length of the evaporator surface. In other embodiments, the evaporator boat can comprise a plurality of reservoirs, recesses or channels along the evaporator surface. The reservoirs can have any desired shape, geometry and/or arrangement. The reservoirs or recesses can be polygonal, circular, elliptical or any combination thereof. Number, shape and arrangement of the reservoirs or recesses can be selected according to several considerations including, but not limited to, molten metal wetting and flow characteristics and evaporator surface area. In some embodiments, an evaporator surface has a design disclosed in U.S. patent application Ser. No. 12/865,817 which is incorporated herein by reference in its entirety. In some embodiments, the evaporator surface can be ground or roughened. Grinding or roughening the evaporator surface may improve molten metal wetting.

The evaporator surface, in some embodiments, can comprise one or more coatings. A coating can provide corrosion resistance as well as enhanced wetting characteristics of the molten metal. For example, all or a portion of the evaporator surface can be coated with a titanium hydride layer. When contacted with molten aluminum, the titanium hydride is converted to a Ti-Al wetting layer. Such titanium hydride coatings are described in U.S. patent application Ser. No. 15/215,170 which is incorporated herein by reference in its entirety. Additional coatings of the evaporator surface are described in U.S. patent application Ser. No. 11/994,180 which is incorporated herein by reference in its entirety. Evaporator surface coatings can have any desired thickness. In some embodiments, evaporator surface coating have thickness of 0.5-20 μm or 1-10 μm.

In some embodiments, evaporator boats having composition and properties described herein can exhibit aluminum (Al) evaporation rate per area ranging from 0.002-0.005 g/min·mm². In other embodiments, aluminum evaporation rate can be 0.003-0.0045 g/min·mm². Moreover, evaporator boats having composition and properties described herein can be resistant to losses in specific electrical resistivity. For example, specific electrical resistivity (1600° C.) of an evaporator boat decreases less than 30 percent over a minimum of 13 hours evaporation boat Al wetting time. In some embodiments, decrease of specific electrical resistivity is less than 20 percent 30 percent over a minimum of 13 hours evaporation boat Al wetting time.

In another aspect, metallization installations are provided. In some embodiments, a metallization installation comprises a plurality of evaporator boats and metal sources. One or more of the evaporator boats comprises a body and an evaporator surface, the body comprising a boron nitride (BN) component and a $TiB_2$ component including a solid solution of $TiB_2$ and one or more elements selected from the group consisting of silicon and metallic elements of Groups IVB-VIIIB of the Periodic Table. The evaporator boats can have any construction and/or properties described herein. Additionally, the metal source can comprise any metal or alloy vaporizable by boats described herein. In some embodiments, the metal source is aluminum. The metal source can have any form not inconsistent with the objectives of the present invention. The metal source, for example, can be in a wire format.

In a further aspect, methods of making evaporator boats are provided. In some embodiments, a method of making an evaporator boat comprises providing a powder mixture including a BN component, a $TiB_2$ component and a metal component and press-heating the powder mixture to provide a boat body, wherein a solid solution of $TiB_2$ and one or more metals from the metal component is formed. Metals of the metal component can comprise silicon and/or one or more transition metals from Groups IVB-VIIIB of the Periodic Table. In some embodiments, one or more metals forming solid solution with $TiB_2$ of the evaporator body are selected from the group consisting of zirconium, hafnium, vanadium, niobium, tantalum, molybdenum, tungsten, iron, cobalt and silicon. Metal(s) of the metal component can be provided to the powder mixture as metal powder, metal carbide powder, metal oxide powder, metal nitride powder or metal boride powder or various combinations thereof. In some embodiments, the powder mixture can further comprise an alkali metal oxide and/or alkaline earth metal oxide in addition to the BN component, $TiB_2$ component and metal component. For example, the powder mixture, in some embodiments, comprises calcium oxide (CaO).

Turning now to specific steps, the powder mixture comprising the BN component, $TiB_2$ component and metal component can be produced by several techniques. In some embodiments, BN powder, $TiB_2$ powder and powder selected from the group consisting of metal powder, metal carbide powder, metal oxide powder, metal nitride powder, metal boride powder and combinations thereof are provided in the desired proportions and intimately mixed to obtain a homogeneous or substantially homogeneous electrical resistivity of the desired value. The powder mixture, in some embodiments, comprises BN and $TiB_2$ in amounts selected from Tables II and III above. Additionally, the metal component can be present in the powder mixture in any amount not inconsistent with the objectives of the present invention. As described herein, the metal component can be added in amount(s) commensurate with solubility limit(s) of one or more metals in $TiB_2$. In other embodiments, the metal component can be present in amounts greater than solubility limits of one or more metals in $TiB_2$. Accordingly, amount of metal component in the powder mixture may be largely dependent on specific metal(s) of the component. The metal component can provide a single metal in the form of metal powder, metal carbide powder, metal oxide powder, metal nitride powder and/or metal boride powder. In some embodiments, for example, the metal component can comprise silicon carbide powder or a transition metal carbide powder, such as a carbide of a transition metal selected from Groups IVB-VIB of the Periodic Table. The metal carbide component can comprise a powder of zirconium carbide, titanium carbide, hafnium carbide, vanadium carbide, niobium carbide, tantalum carbide, chromium carbide, molybdenum carbide or tungsten carbide. Similarly, the metal component can comprise a transition metal powder, transition metal oxide powder, transition metal nitride powder and/or transition metal boride powder, wherein the transition metal is selected from Groups IVB-VIB of the Periodic Table. For example, in some embodiments, transition metal powder is tungsten metal powder.

Alternatively, the metal component can provide two or more metals to the powder mixture. In some embodiments, the metal component can comprise a mixture of two or more metal carbide powders selected from silicon carbide, zirconium carbide, titanium carbide, hafnium carbide, vanadium carbide, niobium carbide, tantalum carbide, chromium carbide, molybdenum carbide and tungsten carbide. In some embodiments, the metal component can include or be formed of solid solution metal carbide powder. For example, the metal carbide component can comprise powder of a solid solution of two or more transition metal carbides. Transition metals of the solid solution, in some embodiments, can be selected from Groups IVB-VIB of the Periodic Table. In one embodiment, a solid solution powder may comprise two or more of tungsten, niobium and zirconium. In further embodiments, the metal carbide powder may comprise metallic binder such as cobalt, iron and/or nickel. In other embodiments, the metal component can comprise a mixture of two or more transition metal oxide powders, transition metal nitride powders, transition metal boride powders and/or transition metal powders. Additionally, the metal component can comprise a mixture of two or more transition metal carbide powders, transition metal oxide powders, transition metal nitride powders and/or transition metal boride powders.

Generally, the metal component can be present in an amount of 0.1 to 15 weight percent of the powder mixture. In some embodiments, the metal component can be present in the powder mixture in an amount selected from Table V.

TABLE V

| Metal Component in Powder Mixture (wt. %) |
| --- |
| 0.1-10 |
| 0.1-5 |
| 0.5-5 |
| 0.1-3 |
| 0.1-1.5 |
| 0.5-1.5 |
| 0.1-1 |
| 5-15 |
| 5-10 |

In some embodiments, the metal component can be milled with the $TiB_2$ component or BN component prior to final mixing of the powder mixture. The powder mixture can further comprise MN in some embodiments.

When complete, the powder mixture is press-heated to provide a boat body. The powder mixture can be loaded into a die and pressed under vacuum at temperatures up to 2000° C. and axial pressures up to 400 tons. Press-heating the powder mixture can provide the boat body in billet form. The billet is subsequently machined to the desired evaporator boat dimensions. Reservoirs, recesses and/or other structures of the evaporator surface can be fabricated in the machining process. Machining can also provide roughening of the evaporator surface for enhancements to molten metal wetting.

As described herein, a solid solution of $TiB_2$ and one or more metals from the metal carbide component is formed from the press heating. The $TiB_2$-metal solid solution can have any composition and properties described hereinabove. Moreover, a solid solution of BN and one or more metals from the metal carbide component can also be formed during the press-heating. In some embodiments, the BN component comprises a solid solution of BN and one or more of titanium zirconium, hafnium, vanadium, niobium, tantalum, molybdenum, tungsten, iron, cobalt and silicon. Grain boundary phases of various compositions are also formed from the press-heating. The grain boundary phases, for example, can have composition and locations provided in Table IV in some embodiments.

These and other embodiments are further illustrated in the following non-limiting examples.

Example 1—Evaporator Boat

A powder mixture having the compositional parameters of Table VI was provided and press-heated under vacuum at 1900° C. and axial pressure of 350 tons for 2 hours.

TABLE VI

| Powder Mixture | |
| --- | --- |
| Component | Amount (wt. %) |
| Hexagonal BN | 49 |
| $TiB_2$ | 40 |
| CaO | 1.0 |
| Metal Component - $ZrB_2$ | $ZrB_2$ - 10 |

Figure 2:
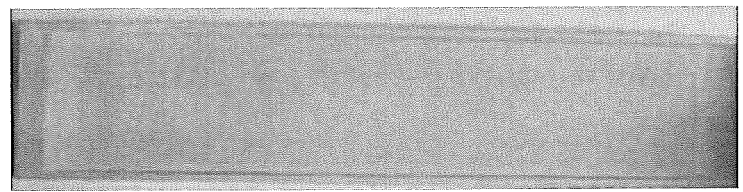
FIG. 2 is a perspective view of an evaporation boat according to some embodiments.
Figure 9:
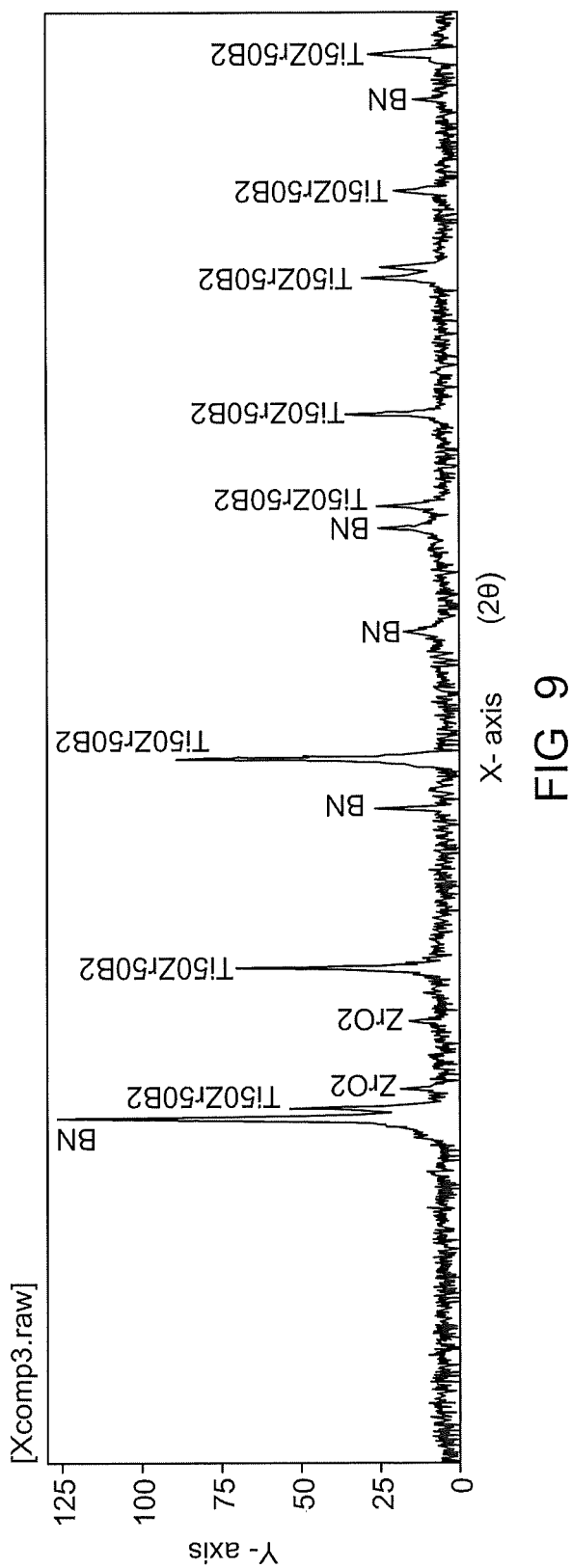
FIG. 9 is an XRD indicating incorporation of zirconium into the TiB$_2$ lattice of the evaporator boat resulting in an (Ti,Zr)B$_2$ phase according to some embodiments.

The resulting billet was machined into a rectangular evaporator boat body comprising a rectangular evaporation surface, similar to that illustrated in FIG. 2. The composition of the evaporator body was subsequently analyzed by XRD. FIG. 9 is diffractogram indicating incorporation of zirconium into the $TiB_2$ lattice resulting in an $(Ti,Zr)B_2$ phase. Specifically, the $(Ti,Zr)B_2$ phase exhibited a stoichiometry of $Ti_{0.5}Zr_{0.5}B_2$. The evaporator boat had a specific electrical resistivity (1600° C.) of 2850 μΩ·cm. Aluminum evaporation rate per area of the boat was determined to be 0.003-0.0035 g/min·mm$^2$.

Example 2—Evaporator Boat

A powder mixture having the compositional parameters of Table VII was provided and press-heated under vacuum at 1900° C. and axial pressure of 300 tons for 2 hours.

TABLE VII

| Powder Mixture | |
| --- | --- |
| Component | Amount (wt. %) |
| Hexagonal BN | 49.9 |
| $TiB_2$ | 39 |
| CaO | 1.1 |
| Metal Component - TiN | TiN - 10 |

The resulting billet was machined into a rectangular evaporator boat body comprising a rectangular evaporation surface, similar to that illustrated in FIG. 2. The composition of the evaporator body was subsequently analyzed by SEM-EDS and X-ray fluorescence (XRF). Titanium from the TiN metal component formed solid solution with the $TiB_2$ phase. The evaporator boat had a specific electrical resistivity (1600° C.) of 2915-2920 μn' cm. Aluminum evaporation rate per area of the boat was determined to be 0.004-0.0045 g/min·mm$^2$.

Example 3—Evaporator Boat

A powder mixture having the compositional parameters of Table VIII was provided and press-heated under vacuum at 1950-2000° C. and axial pressure of 350 tons for 3 hours.

TABLE VIII

| Powder Mixture | |
|---|---|
| Component | Amount (wt. %) |
| Hexagonal BN | 49.1-49.5 |
| $TiB_2$ | 49.1-49.5 |
| CaO | 0.5-1 |
| Metal Component-Tungsten Carbide (WC) | WC: 0.5-1.5 |

Figure 3B:
FIG. 3B maps titanium (Ti) content of the grains imaged in FIG. 3A.
Figure 3A:
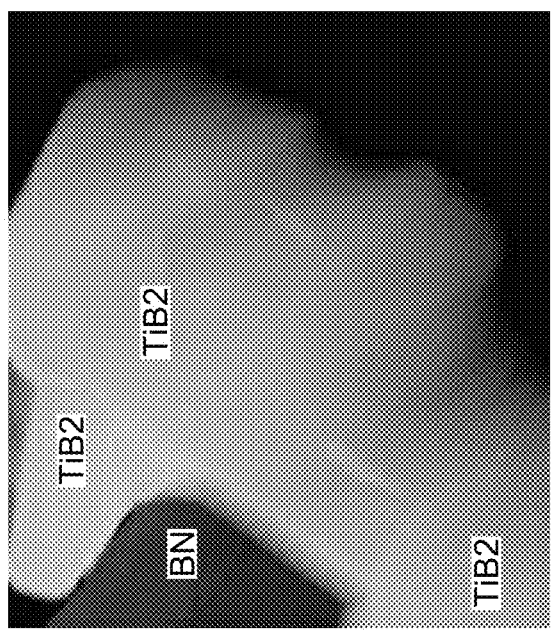
FIG. 3A is a scanning transmission electron microscopy (STEM) image of $TiB_2$ and BN grains of an evaporator body according to some embodiments.
Figure 3D:
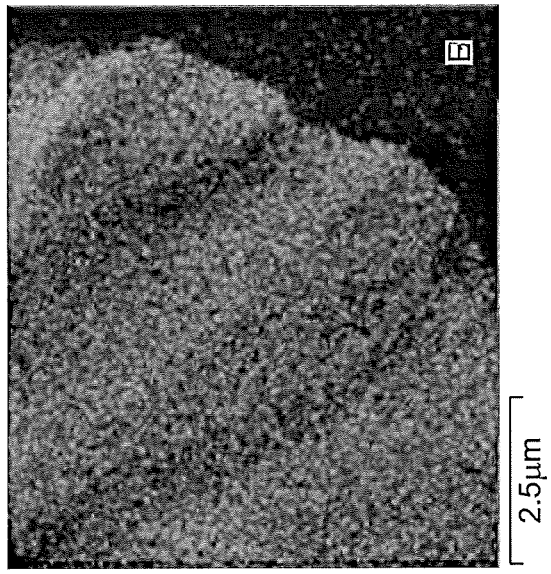
FIG. 3D maps boron (B) content of the grains imaged in FIG. 3A.
Figure 3C:
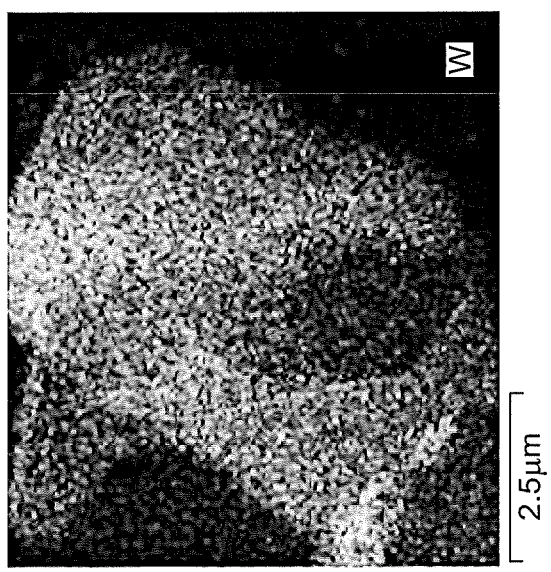
FIG. 3C maps tungsten (W) content of the grains imaged in FIG. 3A.

The resulting billet was machined into a rectangular evaporator boat body comprising a rectangular evaporation surface. FIG. 2 is a picture of the fabricated evaporation boat. The composition and structure of the evaporator boat body was subsequently analyzed by scanning transmission electron microscopy (STEM) and X-ray diffraction (XRD). FIG. 3A is a STEM image of $TiB_2$ and BN grains of the evaporator body. FIGS. 3B, 3C and 3D map titanium, tungsten and boron contents of the grains of FIG. 3A respectively. As illustrated in FIG. 3C, tungsten distribution fills the area occupied by $TiB_2$ grains of FIG. 3A indicating incorporation of tungsten into the $TiB_2$ lattice. Interplanar spacing of the $TiB_2$ grains was also examined via XRD. Results of the XRD are provided in Table IX.

TABLE IX

| $TiB_2$ XRD Results | | |
|---|---|---|
| Reflection | Standard Interplanar Spacing (Angstrom) | Measured Interplanar Spacing (Angstrom) |
| (001) | 3.2284 | 3.3720 |
| (101) | 2.0359 | 2.0030 |
| (002) | 1.6142 | 1.6082 |

Expansion of interplanar spacing along the basal plane (001) direction indicated the incorporation of tungsten into the $TiB_2$ lattice.

Figure 4:
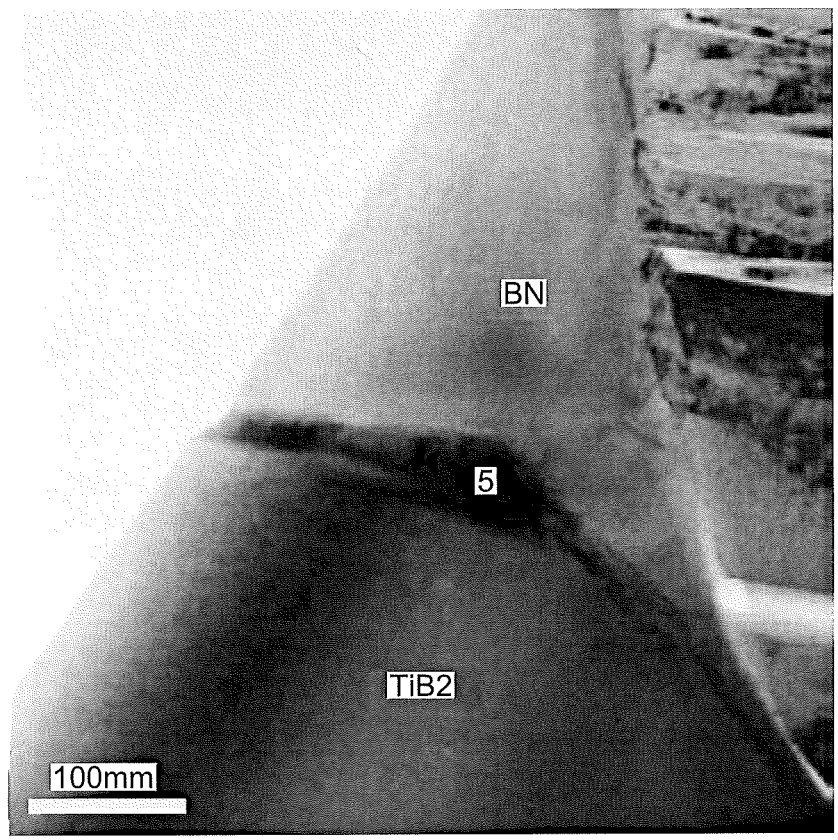
FIG. 4 is a transmission electron microscopy (TEM) image of a $BN/TiB_2$ grain boundary in an evaporator boat body according to some embodiments.

Analysis by transmission electron microscopy (TEM) also identified grain boundary phases comprising various metals. FIG. 4 is a TEM image of a $BN/TiB_2$ grain boundary. Compositional parameters at point 5 in the image are provided Table X.

TABLE X

| $BN/TiB_2$ grain boundary phases | | |
|---|---|---|
| Element | Weight Percent | Atomic Percent |
| Boron | 62.8 | 88.9 |
| Tungsten | 0.3 | 0.2 |
| Titanium | 22.7 | 7.2 |
| Iron | 3.4 | 0.9 |
| Cobalt | 10.8 | 2.8 |

Figure 5:
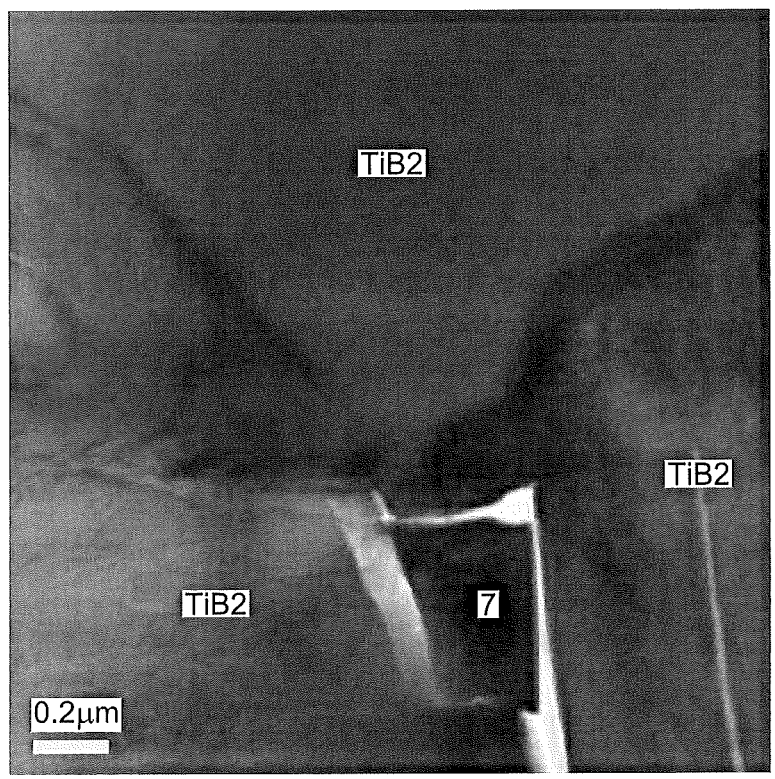
FIG. 5 is a TEM image of $TiB_2$ grains and associated grain boundaries according to some embodiments.

FIG. 5 is a TEM image of $TiB_2$ grains and associated grain boundaries. Compositional parameters at point 7 in a grain boundary are provided in Table XI.

TABLE XI

| $TiB_2/TiB_2$ grain boundary phases | | |
|---|---|---|
| Element | Weight Percent | Atomic Percent |
| Boron | 53.3 | 70.8 |
| Oxygen | 23.1 | 20.8 |
| Calcium | 23.6 | 8.4 |

Figure 6:
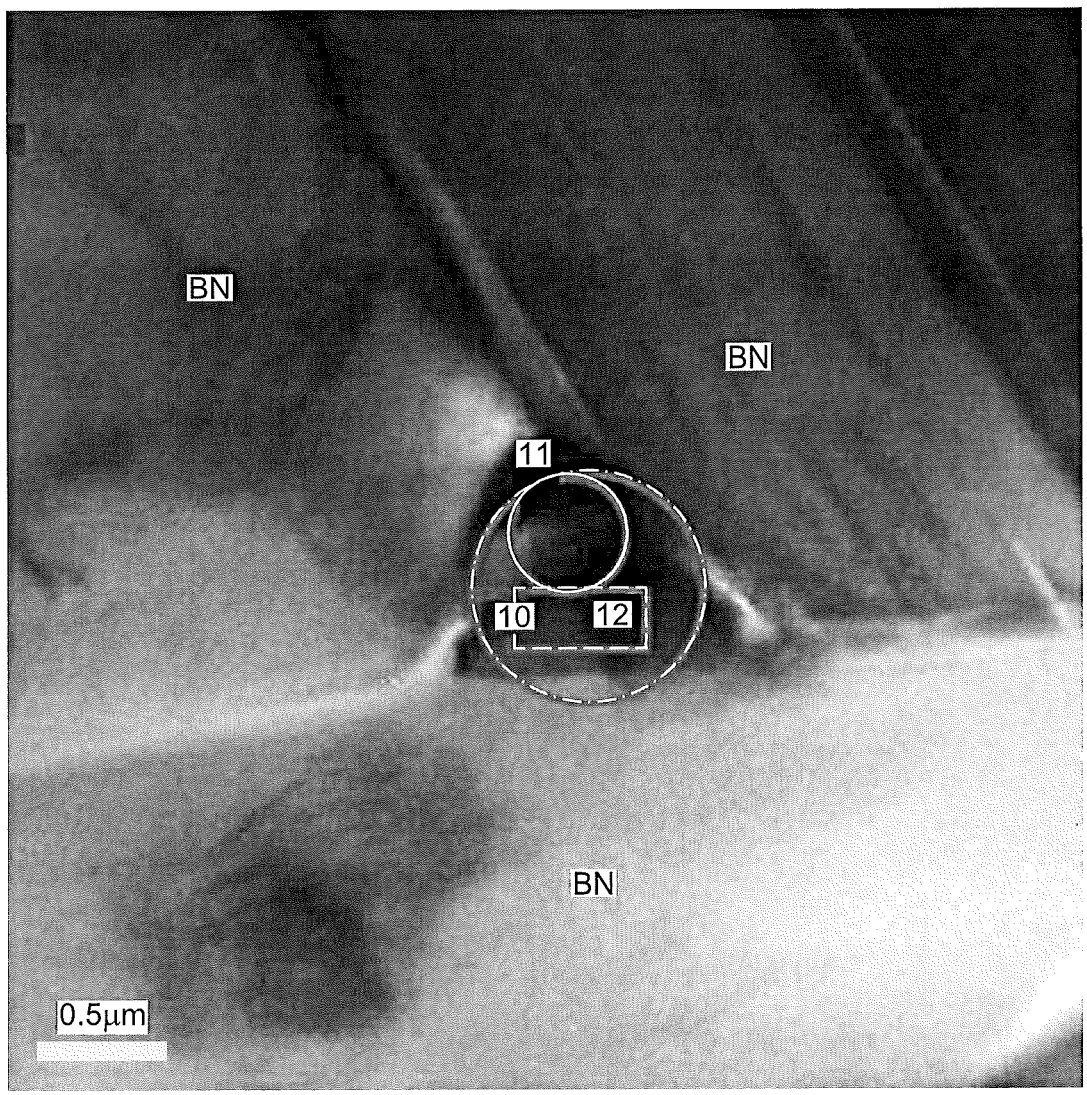
FIG. 6 is a TEM image of BN grains and associated grain boundaries according to some embodiments.

FIG. 6 is a TEM image of BN grains and associated grain boundaries. Composition parameters at points 10-12 are provided in Table XII.

TABLE XII

| BN/BN grain boundary phases (wt. %) | | | | | | | | |
|---|---|---|---|---|---|---|---|---|
| Point | Boron | Nitrogen | Calcium | Titanium | Iron | Cobalt | Tungsten | Oxygen |
| 10 | 77.9 | 10.1 | 0.9 | 8.1 | 0.6 | 2.1 | 0.3 | — |
| 11 | 77.1 | 6.6 | — | 8.2 | 3.0 | 9.1 | 0.3 | 0.7 |
| 12 | 92.9 | — | — | 6.7 | — | — | 0.3 | — |

FIG. 6 also reveals compositional gradients along the grain boundary phases. Elements contained in the region delineated by the large circle include boron, nitrogen, titanium, iron, cobalt, tungsten and calcium. Elements contained within the small circular include boron, nitrogen, titanium, iron and cobalt. Element composition further narrows in the rectangular area where boron, titanium and tungsten are present.

Example 4—Aluminum Vaporization

An evaporator boat having composition and properties of Example 1 was provided. A Comparative 2-component BN/TiB$_2$ evaporator boat was also provided. Specifically, the Comparative evaporator boat had a composition of 50 wt. % BN and 50 wt. % TiB$_2$. The Comparative evaporator boat did not employ a metal component of tungsten carbide as in Example 1. Electrical resistivity (1600° C.) of the evaporator boat of Example 1 and the Comparative boat was determined prior to placement of the evaporator boats in a metallization installation for physical vapor deposition of aluminum on flexible substrates. Electrical resistivity values are provided in Table XIII.

TABLE XIII

| Evaporator Boat Electrical Resistivity 1600° C. (µΩ · cm) | |
| --- | --- |
| Evaporator Boat | Electrical Resistivity |
| Example 1 | 2860 |
| Comparative | 3060 |

Figure 7:
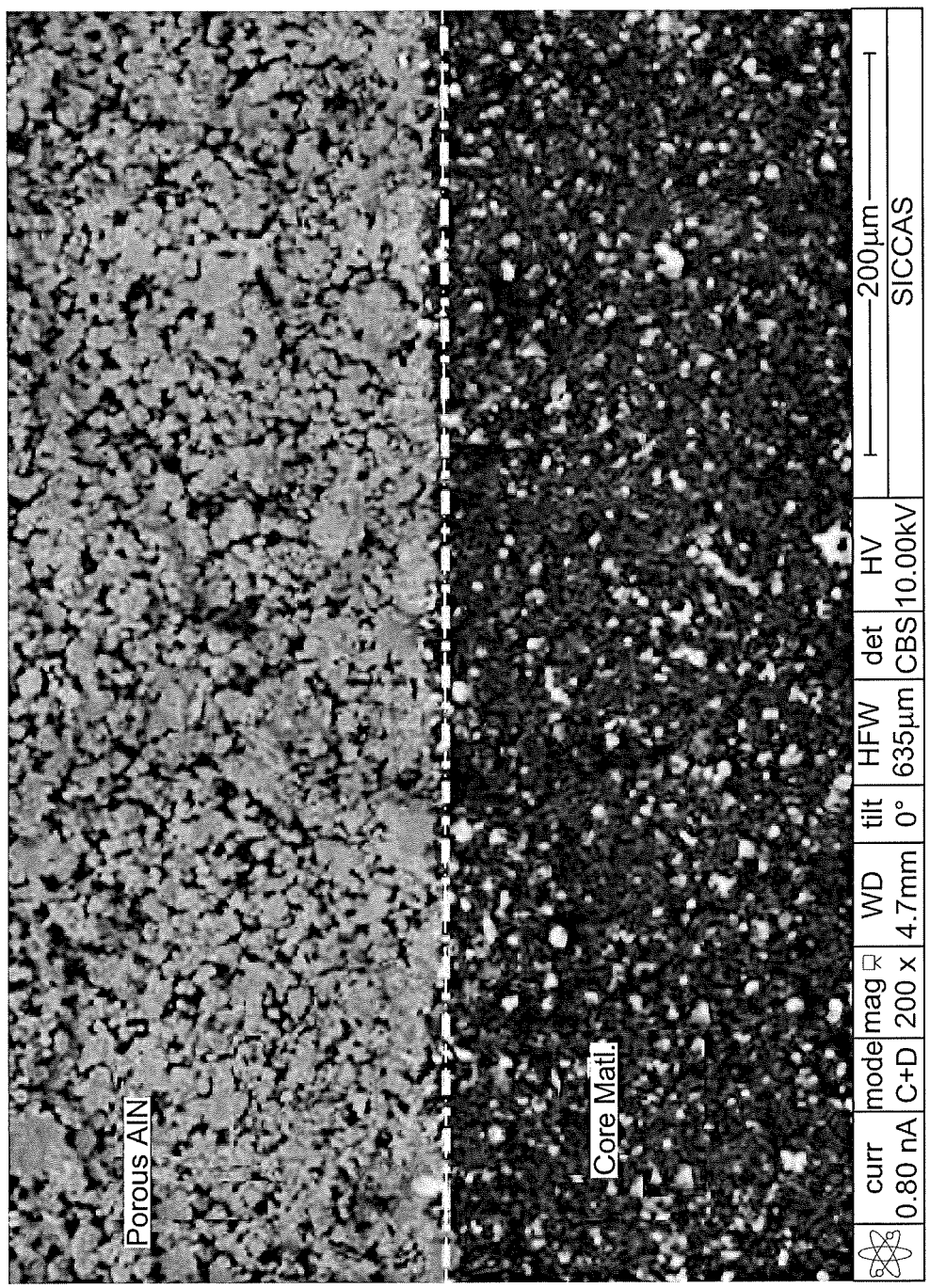
FIG. 7 is a cross-sectional SEM of the evaporator boat of Example 1 herein subsequent to use in an aluminum vaporization installation.
Figure 8:
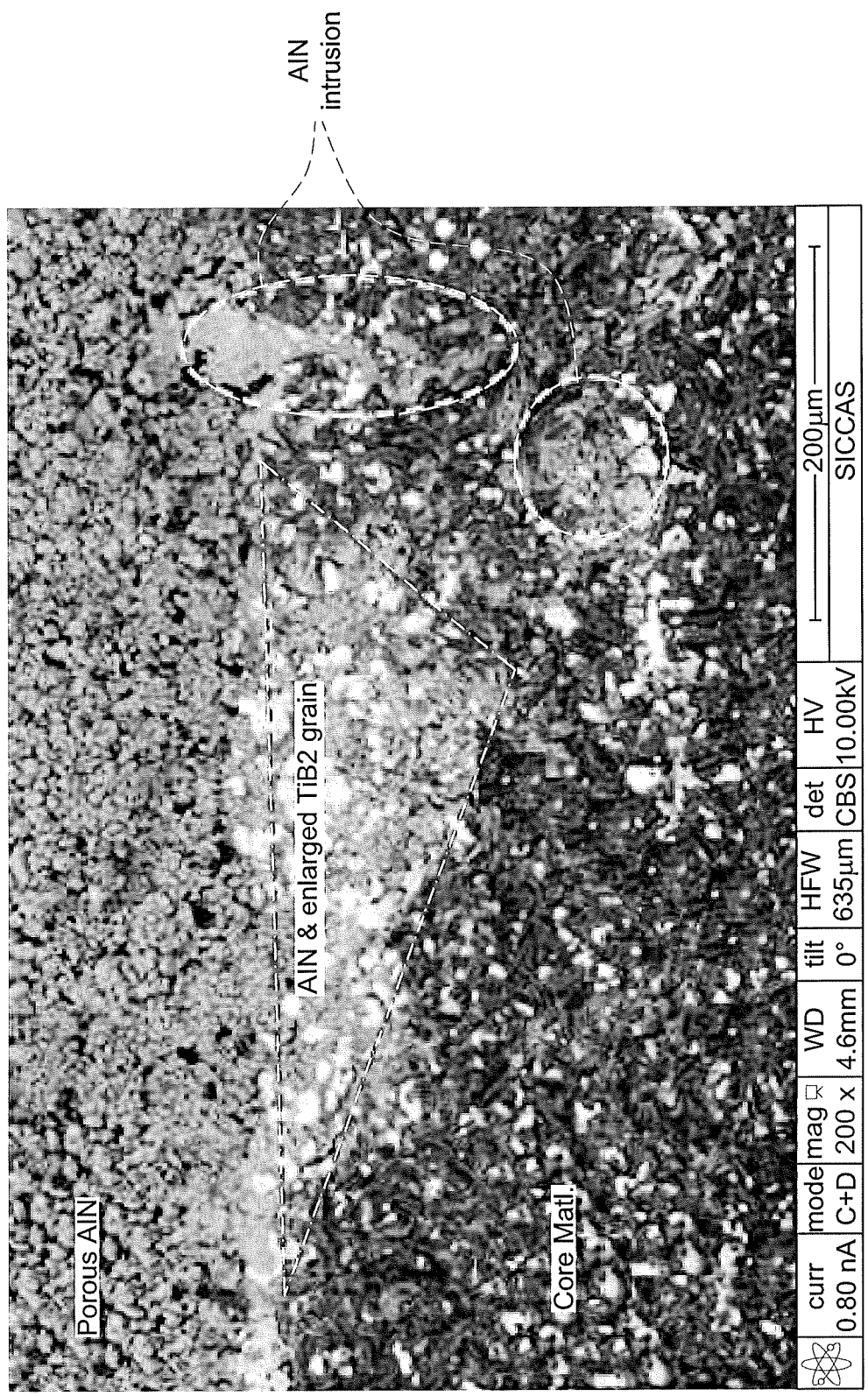
FIG. 8 is a cross-sectional SEM of a comparative evaporator boat subsequent to use in an aluminum vaporization installation.

Upon placement in the metallization installation, the evaporator boat of Example 1 and the Comparative boat were subjected to 20 aluminum evaporation cycles. The boats were removed from the metallization installation and analyzed. FIG. 7 is a cross-sectional SEM of the used evaporator boat of Example 1. As provided in the SEM, a porous AlN layer forms on the evaporator body. Noticeably, a distinct and sharp boundary is formed between the porous AlN layer and the evaporator boat body. This is in sharp contrast to FIG. 1 where a reaction interface layer is formed between the porous AlN layer and evaporator boat body. The distinct boundary illustrated in FIG. 7 demonstrates the evaporator boat's resistance to corrosion and degradation by molten aluminum. Such corrosion resistance can stabilize electrical resistivity of the evaporator boat by slowing consumption of the boat body by aluminum to form electrically conductive AlN. FIG. 8 is a cross-sectional SEM of the used Comparative evaporator boat. A porous AlN layer is also formed on the Comparative evaporator boat. However, a sharp boundary does not exist between the porous AlN layer and Comparative boat body. AlN intrusions penetrate into the body of the evaporation boat. The AlN intrusions illustrate inferiority to corrosion resistance of the Comparative evaporator boat compared to the boat of Example 1. Reduction in corrosion resistance can compromise electrical resistivity of the Comparative boat leading to aluminum vaporization performance losses and premature boat replacement.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. An evaporator boat comprising:
a body and an evaporator surface on the body, the body comprising:
a boron nitride (BN) component including BN grains; and
a titanium diboride (TiB$_2$) component including grains formed of a solid solution of TiB$_2$ and one or more elements selected from the group consisting of silicon and metallic elements of Groups IVB-VIIIB of the Periodic Table, wherein
grain boundaries are formed at interfaces between the BN grains and the TiB$_2$ solid solution grains,
wherein grains of the TiB$_2$ component have an average size of 1 µm to 20 µm, and
wherein the BN component comprises a solid solution of BN and at least one transition metal selected from Groups IVB-VIIIB of the Periodic Table.

2. The evaporator boat of claim 1, wherein the one or more elements forming the solid solution with TiB$_2$ are selected from the group consisting of zirconium, hafnium, vanadium, niobium, tantalum, chromium, molybdenum, tungsten, iron and cobalt.

3. The evaporator boat of claim 1, wherein the solid solution comprises TiB$_2$ and tungsten.

4. The evaporator boat of claim 1, wherein the body comprises grain boundary phases including one or more transition metals, transition metal oxides, transition metal carbides, transition metal nitrides, transition metal borides, alkaline earth metals or mixtures thereof.

5. The evaporator boat of claim 4, wherein BN/BN grain boundary phases comprise at least one of tungsten, iron, cobalt, titanium and calcium.

6. The evaporator boat of claim 4, wherein TiB$_2$/TiB$_2$ grain boundary phases comprise cobalt, calcium or mixtures thereof.

7. The evaporator boat of claim 4, wherein BN/TiB$_2$ grain boundary phases comprise boron, titanium and at least one additional transition metal.

8. The evaporator boat of claim 7, wherein the at least one additional transition metal is selected from Groups IVB-VIIIB of the Periodic Table.

9. The evaporator boat of claim 8, wherein the BN/TiB$_2$ grain boundary phases comprise boron, titanium, tungsten and cobalt.

10. The evaporator boat of claim 1, wherein the at least one transition metal is selected from the group consisting of titanium, zirconium, hafnium, vanadium, niobium, tantalum, chromium, molybdenum, iron, cobalt and tungsten.

11. The evaporator boat of claim 1, wherein the BN component comprises a solid solution of BN and tungsten.

12. The evaporator boat of claim 1, wherein the evaporator surface is ground or roughened.

13. The evaporator boat of claim 1 having specific electrical resistivity (1600° C.) of 2800 to 3400 µΩ·cm.

* * * * *